United States Patent
Tate et al.

(10) Patent No.: US 9,697,075 B2
(45) Date of Patent: Jul. 4, 2017

(54) EFFICIENT SEARCH FOR OPTIMAL READ THRESHOLDS IN FLASH MEMORY

(71) Applicant: Apple Inc., Cupertino, CA (US)

(72) Inventors: Yonathan Tate, Herzliya Pituach (IL); Barak Baum, Herzliya Pituach (IL); Moti Teitel, Herzliya Pituach (IL)

(73) Assignee: APPLE INC., Cupertino, CA (US)

(*) Notice: Subject to any disclaimer, the term of this patent is extended or adjusted under 35 U.S.C. 154(b) by 58 days.

(21) Appl. No.: 14/847,037

(22) Filed: Sep. 8, 2015

(65) Prior Publication Data

US 2017/0068591 A1    Mar. 9, 2017

(51) Int. Cl.

| | | |
|---|---|---|
| G11C 16/04 | (2006.01) | |
| G11C 29/00 | (2006.01) | |
| G06F 11/10 | (2006.01) | |
| G11C 7/14 | (2006.01) | |
| G11C 11/56 | (2006.01) | |
| G11C 16/28 | (2006.01) | |

(52) U.S. Cl.
CPC ............ G06F 11/1068 (2013.01); G11C 7/14 (2013.01); G11C 11/5642 (2013.01); G11C 16/28 (2013.01)

(58) Field of Classification Search
CPC ............ G06F 11/1076; G06F 11/1072; H03M 13/1545; H03M 13/1108; H03M 13/1128
See application file for complete search history.

(56) References Cited

U.S. PATENT DOCUMENTS

| | | | |
|---|---|---|---|
| 8,000,135 B1 | 8/2011 | Perlmutter et al. | |
| 8,156,398 B2 | 4/2012 | Sommer et al. | |
| 8,259,506 B1 | 9/2012 | Sommer et al. | |
| 8,305,811 B2 | 11/2012 | Jeon | |
| 8,369,141 B2 | 2/2013 | Sommer et al. | |
| 8,694,854 B1 | 4/2014 | Dar et al. | |
| 8,773,904 B2 | 7/2014 | Anholt et al. | |

(Continued)

FOREIGN PATENT DOCUMENTS

| | | |
|---|---|---|
| JP | 2011100519 A | 5/2011 |
| JP | 2011165301 A | 8/2011 |

OTHER PUBLICATIONS

U.S. Appl. No. 14/794,862 Office Action dated Nov. 7, 2016.
Baum et al., U.S. Appl. No. 14/794,862, filed Jul. 9, 2015.
Bez et al., "Introduction to Flash Memory", Proceedings of the IEEE, vol. 91, No. 4, pp. 489-502, Apr. 2003.

(Continued)

*Primary Examiner* — Phung M Chung
(74) *Attorney, Agent, or Firm* — D.Kligler IP Services Ltd.

(57) ABSTRACT

A method includes storing data encoded with an ECC in a group of memory cells by writing respective storage values to the memory cells. Multiple sets of readout results are read from the memory cells by comparing the storage values to one or more threshold combinations, each including multiple read thresholds. A plurality of partial syndromes of the ECC is computed, each partial syndrome computed over the readout results that were read using a respective threshold combination. A respective syndrome is calculated for each threshold combination, in at least a subset of all possible threshold combinations, based on one or more of the partial syndromes associated with that threshold combination. A preferred threshold combination is selected, from among the threshold combinations, for which a weight of the respective syndrome is minimal, by processing less than all the partial syndromes associated with all the possible threshold combinations.

20 Claims, 6 Drawing Sheets

(56) References Cited

U.S. PATENT DOCUMENTS

| | | | |
|---|---|---|---|
| 8,830,746 | B2 | 9/2014 | Barkon et al. |
| 8,850,292 | B2 | 9/2014 | Lee |
| 8,869,008 | B2 | 10/2014 | Baum et al. |
| 9,009,390 | B2 | 4/2015 | Choi et al. |
| 2007/0297245 | A1 | 12/2007 | Mokhlesi |
| 2009/0059698 | A1 | 3/2009 | Chang et al. |
| 2009/0199074 | A1* | 8/2009 | Sommer ............ G06F 11/1072 714/763 |
| 2011/0161775 | A1 | 6/2011 | Weingarten |
| 2012/0008401 | A1 | 1/2012 | Katz et al. |
| 2012/0221917 | A1 | 8/2012 | Bueb et al. |
| 2013/0258738 | A1* | 10/2013 | Barkon .............. G11C 11/5642 365/45 |
| 2014/0201596 | A1* | 7/2014 | Baum ................ G06F 11/1068 714/764 |

OTHER PUBLICATIONS

Eitan et al., "Multilevel Flash Cells and their Trade-Offs", Proceedings of the IEEE International Electron Devices Meeting (IEDM), pp. 169-172, Dec. 8-11, 1996.

Eitan et al., "Can NROM, a 2-bit, Trapping Storage NVM Cell, Give a Real Challenge to Floating Gate Cells?" Proceedings of the 1999 International Conference on Solid State Devices and Materials (SSDM), pp. 522-524, Sep. 21-24, 1999.

Maayan et al., "A 512 Mb NROM Flash Data Storage Memory with 8 MB/s Data Rate", Proceedings of the IEEE ntemational Solid-State Circuits Conference, pp. 100-101, Feb. 3-7, 2002.

Kim et al., "Future Memory Technology including Emerging New Memories", Proceedings of the 24th International Conference on Microelectronics (MIEL), vol. 1, pp. 377-384, May 16-19, 2004.

U.S. Appl. No. 14/794,862 Office Action dated Aug. 2, 2016.

\* cited by examiner

| READ OPERATION | TA POSITION | TB POSITION | PARTIAL SYNDROMES | |
|---|---|---|---|---|
| 1 | TA1 | TB1 | PS(TA1) | PS(TB1) |
| 2 | TA2 | TB2 | PS(TA2) | PS(TB2) |
| 3 | TA3 | TB3 | PS(TA3) | PS(TB3) |

| COMBINATION INDEX | TA POSITION | TB POSITION | SYNDROME |
|---|---|---|---|
| 1 | TA1 | TB1 | PS(TA1) XOR PS(TB1) |
| 2 | TA1 | TB2 | PS(TA1) XOR PS(TB2) |
| 3 | TA1 | TB3 | PS(TA1) XOR PS(TB3) |
| 4 | TA2 | TB1 | PS(TA2) XOR PS(TB1) |
| 5 | TA2 | TB2 | PS(TA2) XOR PS(TB2) |
| 6 | TA2 | TB3 | PS(TA2) XOR PS(TB3) |
| 7 | TA3 | TB1 | PS(TA3) XOR PS(TB1) |
| 8 | TA3 | TB2 | PS(TA3) XOR PS(TB2) |
| 9 | TA3 | TB3 | PS(TA3) XOR PS(TB3) |

EFFICIENT SEARCH FOR OPTIMAL READ THRESHOLDS IN FLASH MEMORY

TECHNICAL FIELD

Embodiments described herein relate generally to memory devices, and particularly to methods and systems for setting thresholds for reading memory cells.

BACKGROUND

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24th International Conference on Microelectronics (MIEL), Nis, Serbia and Montenegro, May 16-19, 2004, volume 1, pages 377-384, which is incorporated herein by reference.

Various techniques for setting read thresholds and other read parameters for reading analog memory cells are known in the art. For example, U.S. Pat. No. 8,869,008 whose disclosure is incorporated herein by reference, describes a method that includes storing data that is encoded with an Error Correction Code (ECC) in a group of analog memory cells. The memory cells in the group are read using multiple sets of read thresholds. The memory cells in the group are divided into two or more subsets. N partial syndromes of the ECC are computed, each partial syndrome computed over readout results that were read using a respective set of the read thresholds from a respective subset of the memory cells. For each possible N-bit combination of N bit values at corresponding bit positions in the N partial syndromes, a respective count of the bit positions in which the combination occurs is determined, so as to produce a plurality of counts. An optimal set of read thresholds is calculated based on the counts, and data recovery is performed using the optimal read thresholds.

U.S. Pat. No. 8,773,904, whose disclosure is incorporated herein by reference, describes a method that includes reading a group of analog memory cells using first explicit read thresholds, to produce first readout results. The group is re-read using second explicit read thresholds, to produce second readout results. The group is read using one or more sets of auxiliary thresholds so as to produce auxiliary readout results, such that the number of the auxiliary thresholds in each set is the same as the number of the first explicit read thresholds and the same as the number of the second explicit read thresholds. A readout performance of third read thresholds, which include at least one of the first explicit read thresholds and at least one of the second explicit read thresholds, is evaluated using the first, second and auxiliary readout results.

SUMMARY

An embodiment that is described herein provides a method for adjusting read thresholds, including storing data encoded with an Error Correction Code (ECC) in a group of memory cells by writing respective storage values to the memory cells in the group. Multiple sets of readout results are read from the memory cells in the group by comparing the storage values to one or more different, respective threshold combinations, each including multiple read thresholds. A plurality of partial syndromes of the ECC is computed, each partial syndrome computed over the readout results that were read using a respective threshold combination from a respective subset of the memory cells. A respective syndrome is calculated for each threshold combination, in at least a subset of all possible threshold combinations, based on one or more of the partial syndromes that are associated with that threshold combination. A preferred threshold combination is selected, from among the at least subset of threshold combinations, for which a weight of the respective syndrome is minimal, by processing less than all the partial syndromes associated with all the possible threshold combinations.

In some embodiments, selecting the preferred threshold combination includes identifying a given threshold combination in which the weight of the respective syndrome falls below a predefined weight threshold, and in response to identifying the given threshold combination searching for the preferred threshold only among threshold combinations in a vicinity of the identified threshold combination. In other embodiments, searching in the vicinity of the identified threshold combination includes transitioning between adjacent threshold combinations by changing a position of only one of the read thresholds.

In yet other embodiments, selecting the preferred threshold combination includes scanning the threshold combinations in an order in which adjacent threshold combinations differ in a position of only one read threshold, and calculating the syndrome includes calculating the syndrome based on a previous syndrome calculated in a previously scanned threshold combination.

In an embodiment, calculating the syndrome includes simultaneously calculating multiple syndromes, corresponding to respective different threshold combinations. In another embodiment, calculating the syndrome includes accumulating syndrome weights corresponding to portions of the syndrome that are calculated separately, and terminating calculating the syndrome if the accumulated weight exceeds a maximal weight threshold. In yet another embodiment, each of the portions is associated with a respective dedicated maximal weight threshold.

In some embodiments, selecting the preferred threshold is carried out in multiple iterations, and calculating the syndrome includes determining the maximal weight threshold in one iteration based on a syndrome weight calculated in a previous iteration. In other embodiments, calculating the syndrome includes processing the portions in an order that maximizes saturation-indicative information that the accumulated weight bears. In yet other embodiments, selecting the preferred threshold combination includes identifying an invalid position of one of the read thresholds, which causes syndrome saturation regardless of positions of other thresholds, and excluding from the subset of threshold combinations all of the threshold combinations that contain the invalid position.

In an embodiment, selecting the preferred threshold combination is carried out in multiple iterations, each iteration starts with the threshold combination selected in a previous iteration, and positions of the read thresholds in a given iteration are determined at a resolution finer than in the previous iteration.

There is additionally provided, in accordance with an embodiment that is described herein, an apparatus that includes an interface and storage circuitry. The interface is configured to communicate with a memory that includes multiple memory cells. The storage circuitry is configured to store data encoded with an Error Correction Code (ECC) in a group of the memory cells by writing respective storage values to the memory cells in the group, to read from the memory cells in the group multiple sets of readout results by comparing the storage values to one or more different, respective threshold combinations, each including multiple read thresholds, to compute a plurality of partial syndromes of the ECC, each partial syndrome computed over the readout results that were read using a respective threshold combination from a respective subset of the memory cells, to calculate a respective syndrome for each threshold combination in at least a subset of all possible threshold combinations, based on one or more of the partial syndromes that are associated with that threshold combination, and to select a preferred threshold combination, from among the at least subset of threshold combinations, for which a weight of the respective syndrome is minimal, by processing less than all the partial syndromes associated with all the possible threshold combinations.

These and other embodiment will be more fully understood from the following detailed description of the embodiments thereof, taken together with the drawings in which:

DETAILED DESCRIPTION OF EMBODIMENTS

Overview

Figure 1:
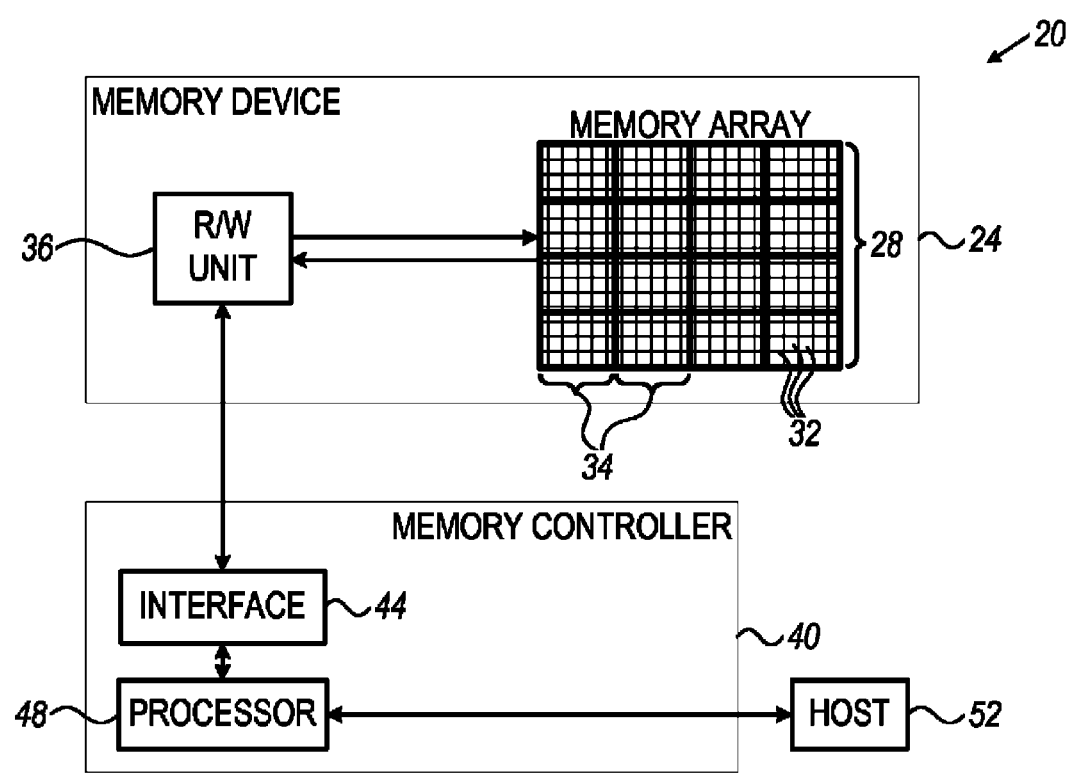
FIG. 1 is a block diagram that schematically illustrates a memory system, in accordance with an embodiment that is described herein.

In various types of memory devices that store data in analog memory cells, reading the data is carried out by setting one or more read thresholds. The readout performance in terms of readout errors relies on accurate positioning of the read thresholds. Typically, each of the read thresholds can be set to one of multiple discrete positions. A set of read thresholds that are each set to one of its allowed positions is referred to herein as a "threshold combination." A "threshold search" procedure refers to a procedure for selecting an optimal threshold combination that achieves the best read performance among the threshold combinations.

Data read from a group of memory cells may contain errors, especially when one or more of the read thresholds are set far from their respective optimal positions. In some applications, the data is stored encoded in accordance with an error correction code (ECC) that can be represented by multiple check equations. A syndrome vector that is generated, for example, by multiplying the readout data vector by a parity-check matrix of the ECC is indicative of the error pattern. The weight of the syndrome vector, i.e., the sum of the vector non-zero elements, may serve as a measure of the readout performance, so that best performance is achieved by a threshold combination for which the syndrome weight is minimal. The term "syndrome weight" is also referred to herein as "syndrome sum."

Calculating the syndrome for certain threshold combinations can be carried out without actually reading the group of memory cells using these threshold combinations. Instead, multiple partial syndromes can be derived (per read threshold) by reading respective subgroup of the group of cells using a small subset of the entire threshold combinations, and calculating the syndromes in other threshold combinations using the partial syndromes.

Consider a group of memory cells that is read using $N_t$ read thresholds, each having $N_s$ predefined discrete positions. In principle, a threshold search procedure may scan the entire set of $(N_s)^{N_t}$ threshold combinations, wherein in each threshold combination the syndrome is produced by combining $N_t$ pre-calculated partial syndromes that are associated with this threshold combination. In many applications this brute-force solution is impractical, because the number of possible threshold combinations is very large, thus limiting the memory readout throughput. In example Flash memories, the number of read thresholds $N_t$ may be 1,2 for MLC devices, 1,2,3,4 for TLC devices and up to 8 for QLC devices. The number of threshold positions $N_s$ may be in the range 2-15, wherein in some embodiments $N_s$ is set to 3, 5 or 7. Alternatively, other suitable number of read thresholds and positions per threshold can also be used. In an example embodiment $N_t=2$, $N_s=7$ and the total number of threshold combinations is $7^2=49$.

Embodiments that are described herein provide improved methods and systems for best positioning of the read thresholds. In the disclosed techniques, two main approaches are employed for reducing the search complexity. In one approach, the complexity is reduced by scanning only a subset of all the possible threshold combinations. In another approach, the threshold combinations are ordered so that the syndrome in a given threshold combination is derived efficiently from a syndrome calculated in a previous threshold combination. Using the disclosed techniques improves the memory readout throughput and power consumption, considerably.

In some embodiments, the threshold search procedure starts performing an exhaustive search over the threshold combinations. When the syndrome weight drops below a predefined threshold weight, the procedure aborts the exhaustive search and moves to a linear descent search that scans only a small subset of the threshold combinations. The linear descent search is usually applicable when the total number of errors is sufficiently small so that the syndrome weight behaves approximately linearly as a function of the number of errors.

Under the linearity assumption, it is sufficient to scan only threshold combinations in the vicinity of an "anchor combination" having a low syndrome weight. In an embodiment, in the linear descent search, the threshold combinations are scanned by changing the position of only one threshold at a time and retaining the other read thresholds fixed.

In some embodiments, the syndrome is divided into L-bit chunks that are referred to herein as "layers." In a given threshold combination, the syndrome weight is calculated separately in each layer and accumulated as an intermediate weight. A high-valued intermediate weight indicates that the syndrome is probably saturated (i.e., the number of errors is large), in which case processing the current threshold combination is terminated.

In some embodiments, the processing order of the layers is selected so as to maximize the saturation-indicative information that the intermediate weight bears. The optimal layer ordering depends on the code structure and can be determined at design time. In an embodiment, the saturation threshold per layer is determined to meet requirements regarding probabilities of falsely terminating the syndrome calculation when the syndrome is actually unsaturated, or falsely continuing the syndrome calculation when the syndrome is actually saturated. In another embodiment, during acquisition and/or tracking, the saturation thresholds are determined based on a syndrome weight calculated in a previous application of the method.

In some embodiments, the threshold combinations are scanned according to Gray code ordering, according to which the position of only one of the read thresholds changes between adjacent threshold combinations. Thus, the syndrome can be calculated based on the syndrome of the previous combination by retrieving and XORing only two partial syndromes (of the threshold that changes) rather than $N_t$ partial syndromes. In an embodiment, the XOR results are calculated and stored when deriving the partial syndromes, thus only one retrieval and one XOR operation is requited per combination transition.

In some hardware implementations, processing the syndromes is carried out in multiple processing units in parallel. In an example embodiment, $N_s$ processing units calculate $N_s$ syndromes simultaneously. In such embodiments, the $N_s$ positions of one threshold combinations are associated with the $N_s$ processing units, and the other thresholds share Gray ordering search among the processing units.

In some embodiments, the threshold search procedure employs both Gray ordering of the threshold combinations and syndrome processing in layers. If, when processing a given layer, one or more of the threshold positions are identified as causing syndrome saturation, all the thresholds combinations that contain these threshold positions are eliminated from the search in processing subsequent layers.

In some embodiments, the voltage resolution of the threshold positions is changed adaptively. In an example embodiment, the threshold search procedure (i.e., using the disclosed techniques) starts with threshold positions of a coarse resolution, and uses the optimal threshold combination found as an anchor for defining threshold positions at a finer resolution in the following iteration.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^7$ memory cells, whereas a page is on the order of $10^4$-$10^5$ memory cells.

The description that follows describes several example techniques for selecting read thresholds for reading the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W circuitry in any suitable manner, or performed by any one of these elements. Thus, in the context of the present patent application and in the claims, memory controller 40 and R/W circuitry 36 are referred to jointly as storage circuitry that carries out the disclosed techniques.

Adaptive Adjustment of Read Thresholds

Figures 2, 3A, 3B:
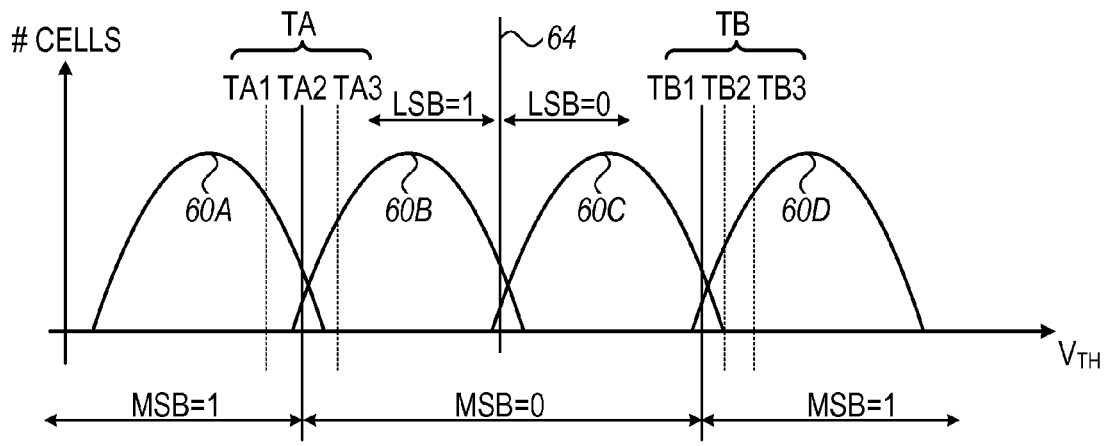
FIG. 2 is a diagram showing readout from a group of memory cells using multiple read threshold sets, in accordance with an embodiment that is described herein.
FIGS. 3A and 3B are tables showing threshold sets used for calculating partial syndromes, and schemes for deriving syndromes from the partial syndromes, in accordance with embodiments that are described herein.

FIG. 2 is a diagram showing readout from a group of memory cells using multiple read threshold sets, in accordance with an embodiment that is described herein. In the present embodiment, memory cells 32 comprise four-level MLC, each holding two data bits. In alternative embodiments, the disclosed techniques can be used for selecting read thresholds for reading any other suitable type of MLC, such as eight-level or sixteen-level MLC.

In the example of FIG. 2, a group of memory cells, typically along a given word line, holds two data pages—A page referred to as Least Significant Bit (LSB) page in the first bit of the memory cells in the group, and another page referred to as Most Significant Bit (MSB) page in the second bit of the memory cells in the group.

The figure shows the threshold voltage ($V_{TH}$) distribution in the memory cells in the group. In this example, the threshold voltage is distributed in four distributions 60A . . . 60D that correspond to four respective programming levels. Each programming level represents a respective combination of two bits—An LSB and an MSB:

TABLE 1

Example mapping of LSB and MSB to programming levels

| Programming level | LSB | MSB |
|---|---|---|
| 60A | 1 | 1 |
| 60B | 1 | 0 |
| 60C | 0 | 0 |
| 60D | 0 | 1 |

This mapping uses Gray coding, in which any two adjacent programming levels differ from one another by only a single bit value. Moreover, in this mapping the lowest two programming levels correspond to LSB="1", and the highest two programming levels correspond to LSB="0".

Typically, R/W unit 36 reads the LSB page by comparing the cell threshold voltages to an LSB read threshold 64. Memory cells whose threshold voltage falls below threshold 64 are regarded as holding LSB="1", and memory cells whose threshold voltage falls above threshold 64 are regarded as holding LSB="0".

Unit 36 typically reads the MSB page by comparing the cell threshold voltages to a pair of MSB read thresholds TA and TB, wherein TA and TB are selected from among the sets of threshold positions {TA1, TA2, TA3} and {TB1, TB2, TB3}, respectively. Given a pair of thresholds TAi and TBj wherein 1≤i,j≤3, memory cells whose threshold voltage falls between TAi and TBj are regarded as holding MSB="0", and memory cells whose threshold voltage falls below threshold TAi or above threshold TBj are regarded as holding MSB="1".

In practice, the shapes and positions of distributions 60A . . . 60D may vary over time and from one group of memory cells to another. Accurate positioning of the read thresholds has a considerable impact on the probability of read errors, especially when the programming level distributions are closely spaced or even partially overlapping. Since the boundary regions between distributions vary over time and between memory cell groups, the read threshold positions should typically be adjusted in an adaptive manner.

Read Threshold Search Based on Syndrome Weight

To find a pair of thresholds TA and TB that are best positioned for reading the MSB page, the memory controller can search among the entire set of pairs (TAi,TBj), and choose the best-performing pair. In the embodiments described below, the readout performance is related to the number of non-zero elements in a syndrome vector that is derived from the readout vector. In the present example, as seen in FIG. 2, for best readout performance, the thresholds TA and TB should be positioned at TA2 and TB1, respectively.

In the disclosed techniques, the data is stored encoded in accordance with some ECC that can be represented by a set of check equations. A valid code word C of the ECC satisfies the entire set of check equations, i.e., H·C=0, wherein H denotes a respective parity-check matrix representation of the ECC.

Some schemes for decoding the ECC are based on deriving a syndrome vector from the readout vector to be decoded. Let X=C+E denote a readout vector X in which E represents the vector of errors and C is a valid code word of the ECC. The syndrome S is defined as S=H·X. Since S=H·(C+E)=H·E, the syndrome S is indicative of the error pattern E. Note that arithmetic operations such as in the expression H·(C+E) are applied using modulo-2 arithmetic.

In the disclosed embodiments, the weight of the syndrome vector, i.e., the number of non-zero elements in the syndrome vector, serves for measuring the readout performance. For example, for a binary syndrome vector S of length P, the weight W(S) can be evaluated as the sum of the syndrome bits:

$$W(S) = \sum_{k=1}^{P} S_k \qquad \text{Equation 1}$$

wherein $S_k$ denotes the $k^{th}$ bit of S, and the sum is calculated without applying any modulo-2 operation.

The weight W(S) is also referred to herein as the "syndrome-sum" of S. When performing exhaustive search among all possible threshold combinations, the memory controller calculates the syndrome for every pair (TAi,TBj), and selects the optimal combination for which W(S) is minimal.

In the example of FIG. 2, each of the thresholds TA and TB has three possible positions, and the total number of threshold combinations is therefore $3^2=9$. As will be described below, in the disclosed embodiments, the syndromes for at least some of the threshold combinations can be derived from partial syndromes that are calculated for a small subset of entire set of threshold combinations.

FIGS. 3A and 3B are tables showing threshold sets used for calculating partial syndromes, and schemes for deriving syndromes from the partial syndromes, in accordance with embodiments that are described herein. The tables in FIGS. 3A and 3B are related to the distributions and thresholds of FIG. 2. Example methods for deriving the syndrome vector from previously calculated partial syndromes are described, for example, in U.S. Pat. No. 8,773,904, cited above.

In an example embodiment, with reference to FIG. 2, the memory controller performs three readout operations with the thresholds TA and TB set to (TA1,TB1), (TA2,TB2) and (TA3,TB3). For each readout result X(i), i=1, 2, 3, the memory controller generates two sub-vectors XA(i) and XB(i). Sub-vector XA(i) contains the readout results of the memory cells for which LSB=1, and zero values for the memory cells for which LSB=0. Similarly, sub-vector XB(i) contains the readout results of the memory cells for which LSB=0, and zero values for the memory cells for which LSB=1.

Based on XA(i) and XB(i), the memory controller calculates two partial syndromes PS(TAi)=H·XA(i) and PS(TBi)=H·XB(i). The table depicted in FIG. 3A summarizes the thresholds used in the different readout operations and the derived partial syndromes. In the present example, the memory controller derives 2·3=6 partial syndromes.

Note that the partial syndromes calculated using sub-vector XA(i) (LSB=1) correspond to readout results that are determined by positioning threshold TA at TA1, TA2 or TA3. Similarly, the partial syndrome calculated using XB(i) (LSB=0) corresponds to readout results that are determined by setting TB to TB1, TB2 or TB3.

For each of the $3^2=9$ threshold combinations, the memory controller can calculate the respective syndrome (and the syndrome sum) by combining the partial syndromes associated with the respective threshold combination. In some embodiments, the syndrome and partial syndromes are binary and the syndrome is calculated using bitwise XOR between the respective partial syndromes. Alternatively, non-binary partial syndromes can be combined using suitable sum operations. The table in FIG. 3B summarizes the syndrome calculations for the nine threshold combinations. For example, the syndrome corresponding to threshold combination (TA3,TB1) is calculated by combining PS(TA3) and PS(TB1).

The thresholds used in the three readout operations, as described above, are also referred to herein as explicit thresholds. The syndrome derived using an explicit threshold set can be calculated directly rather than using partial syndromes. Threshold combinations for which the syndrome is derived from the partial syndromes and not by explicit readout using these thresholds are also referred to herein as hybrid thresholds.

After evaluating the readout performance of the various read threshold pairs, the memory controller selects the pair of read thresholds that exhibits the best readout performance (i.e., having minimal syndrome weight). The selected pair of read thresholds (either explicit or hybrid) is used for recovering the data stored in the group of memory cells.

The disclosed technique can be used in a similar manner with sets of more than two read thresholds, and a number of threshold positions different than three. Consider, for example, a group of 3 bits/cell memory cells storing an LSB page, a Center Significance Bit (CSB) page and an MSB page using the following bit mapping and read threshold configuration:

TABLE 2

Example 3 bits/cell configuration

| Programmed pages | Data value | $V_{TH}$ range |
|---|---|---|
| LSB | "1" | $V_{TH} < RV_{11}$ |
|  | "0" | $V_{TH} > RV_{11}$ |
| LSB, CSB | "11" | $V_{TH} < RV_{21}$ |
|  | "10" | $RV_{21} < V_{TH} < RV_{22}$ |
|  | "00" | $RV_{22} < V_{TH} < RV_{23}$ |
|  | "01" | $V_{TH} > RV_{23}$ |
| LSB, CSB, MSB | "111" | $V_{TH} < RV_{31}$ |
|  | "110" | $RV_{31} < V_{TH} < RV_{32}$ |
|  | "100" | $RV_{32} < V_{TH} < RV_{33}$ |
|  | "101" | $RV_{33} < V_{TH} < RV_{34}$ |
|  | "001" | $RV_{34} < V_{TH} < RV_{35}$ |
|  | "000" | $RV_{35} < V_{TH} < RV_{36}$ |
|  | "010" | $RV_{36} < V_{TH} < RV_{37}$ |
|  | "011" | $V_{TH} > RV_{37}$ |

In this example, the MSB page is read using a set of four MSB thresholds denoted $\{TA=RV_{31}, TB=RV_{33}, TC=RV_{35}, TD=RV_{37}\}$, wherein each of the read thresholds has two possible positions: (TA1,TA2), (TB1,TB2), (TC1,TC2) and (TD1,TD2). Assume that the MSB page is read twice using two explicit sets of thresholds $\{TA1,TB1,TC1,TD1\}$ and $\{TA2,TB2,TC2,TD2\}$. In an embodiment, the memory controller derives for a given readout X(i), i=1, 2, four sub-vectors XA(i) ... XD(i) in accordance with the respective four combinations of LSB and CSB readouts. Each of the LSB, CSB combinations is associated with a respective threshold TA ... TD. The memory controller calculates two partial syndromes for each respective sub-vector: PS(TAi)=H·XA(i), PS(TBi)=H·XB(i), PS(TCi)=H·X(i) and PS(TDi)=H·XD(i), i=1, 2. The syndrome for a selected threshold combination, e.g., $\{TA1,TB2,TC1,TD2\}$ is derived from the respective partial syndromes: S=XOR[PS(TA1),PS(TB2), PS(TC1),PS(TD2)].

Let $N_t$ denote the number of read thresholds, and $N_s$ the number of positions per threshold. In this example $N_t=4$ and $N_s=2$. The memory controller performs two ($N_s$) readout operations to generate 4·2=8 ($N_t \cdot N_s$) partial syndromes. The total number of threshold combinations in this example is given by $2^4=16$ ($N_s$ to the power of $N_t$).

Efficient Threshold Search at Low Bit Error Rate

The syndrome of a given readout result X=C+E is a linear function of X (S=H·X). For certain ECC codes, such as Low Density Parity Check (LDPC) codes, it can be shown, that at low bit error rates, the syndrome weight W(S) behaves approximately as a linear function of the number of errors W(E), i.e., W(S)=W(H·E)=α·W(E), wherein α is a positive scalar. For example, for a LDPC code in which every bit of the code word participates in a number of dv parity-check equations (i.e., dv is the variable degree), the syndrome weight can be approximated as:

$$W(S) \approx dv \cdot N_e = dv \cdot \sum_{Thresholds} N_e[Threshold(i)] \qquad \text{Equation 2}$$

wherein $N_e$ is the total number of errors in E, and $N_e$[Threshold(i)] is the number of errors at the vicinity of Threshold(i), i=1 ... $N_t$. A syndrome, for which the approximation in Equation 2 is invalid because the number of errors is too high, is referred to herein as a "saturated syndrome." Typically, a saturated syndrome has a large weight value. When S is saturated, W(S) does not grow linearly with $N_e$, but remains saturated at an approximate value: W(S)≈length(S)/2. If, for example, Equation 2 holds up to a maximal number of errors MAX_$N_e$, the weight of a saturated syndrome S_SAT satisfies W(S_SAT)≈dv·MAX_$N_e$≤dv·$N_e$. In practice, saturation is identified using a weight threshold lower than (dv·MAX_$N_e$) to ensure correct identification of the linear working zone.

Non-linearity in Equation 2 may occur, for example, when two (or any larger even number of) errors participate in the same check equation, causing the check equation result to be zero. When at low BER, and assuming a unified distribution across cells, the probability of two or more errors within the same check equation is very low, and therefore linearity is guaranteed with high probability.

Equation 2 implies that a small change ΔThreshold(i) in a single threshold that corresponds to a respective change ΔW(S) in the syndrome weight is (approximately) proportional to the respective change in the number of errors ΔNe[Threshold(i)] caused by changing the threshold. Consequently, when at low BERs, it is sufficient to search among threshold combinations in which a single threshold changes position, and all the other thresholds remain fixed. In the description that follows, a search of this type is referred to as a linear descent search.

Figure 4:
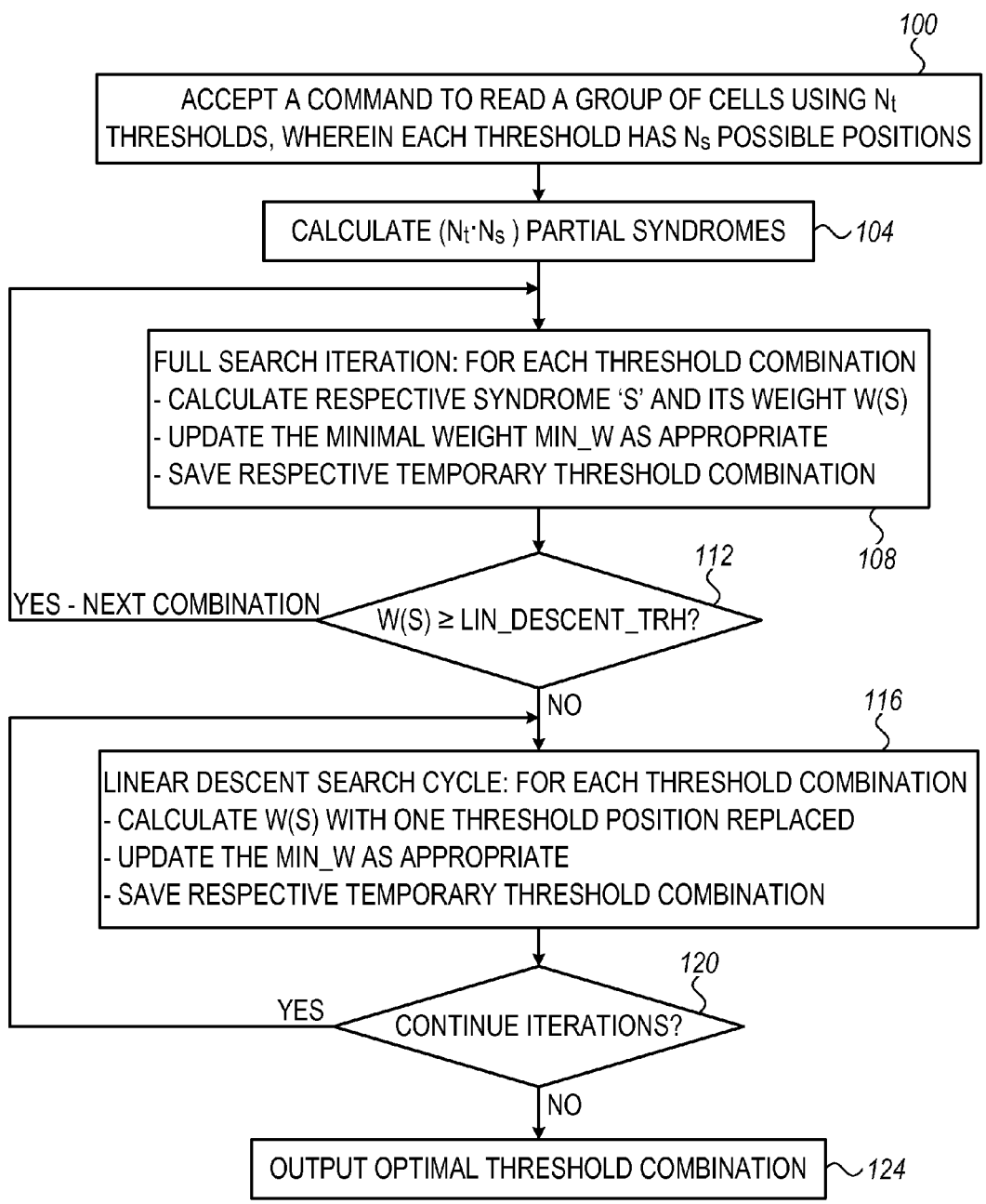
FIG. 4 is a flow chart that schematically illustrates a method for efficient threshold search at a low Bit Error Rate (BER), in accordance with an embodiment that is described herein.

FIG. 4 is a flow chart that schematically illustrates a method for efficient threshold search at a low Bit Error Rate (BER), in accordance with an embodiment that is described herein. The method begins with memory controller 40 accepting a command for reading a group of memory cells using a number of $N_t$ thresholds, at a command accepting step 100. For example, in a 2 bit/cell MLC the command may indicate reading an MSB page using two thresholds. In the present example, each of the $N_t$ thresholds can be set to $N_s$ predefined positions. At a partial syndrome calculation step 104, the memory controller calculates, for each of the $N_t$ read thresholds, $N_s$ partial syndromes, i.e., a total number of $N_t \cdot N_s$ partial syndromes. In some embodiments, calculating the partial syndromes involves $N_s$ readout operations, wherein in the $i^{th}$ readout operation each of the thresholds is set to its $i^{th}$ position, as described above.

At a full search step 108, the memory controller searches among all the $(N_s)^{N_t}$ possible threshold combinations. The memory controller selects a threshold combination, retrieves the $N_s$ partial syndromes corresponding to this combination, and applies an addition operation, in the underlying field (e.g., $GF(2^m)$ for some m), among the partial syndromes, to produce the syndrome. When using binary codes, the addition operation can be implemented using a bitwise XOR operation. The memory controller calculates the syndrome weight W(S) and when W(S)<MIN_W, updates the minimal weight MIN_W and saves the respective threshold combination as the current optimal combination.

At a BER estimation step 112, the memory controller compares between W(S) and a linear descent threshold LIN_DESCENT_THR. IF W(S)≥LIN_DESCENT_THR, the memory controller loops back to step 108 to evaluate subsequent threshold combinations of the full search. Otherwise, W(S) is smaller than LIN_DESCENT_THR, and the controller proceeds to a linear descent search step 116.

At step 116, the memory controller starts with the current threshold combination recently found at step 108 (also referred to herein as an anchor threshold combination). In one linear descent cycle, the memory controller scans the $N_t$ thresholds by going through all the $N_s$ positions of a single threshold while all the other thresholds remain fixed. For each selected threshold combination, the memory controller re-calculates the syndrome S and its weight W(S), and updates MIN_W and the respective current optimal threshold combination, as appropriate.

Assume, for example, reading an MSB page using two thresholds TA and TB that can be set to three positions {TA1,TA2,TA3} and {TB1,TB2,TB3}, respectively. Further assume that the linear descent search starts with threshold combination (TA1,TB3). Table 3 below depicts example threshold combinations to be evaluated during a linear descent search cycle.

TABLE 3

Threshold combinations used in a linear descent search cycle

| Threshold Combination Index | TA position | TB position |
|---|---|---|
| 1 | TA1 | TB1 |
| 2 | TA1 | TB2 <- |
| 3 | TA1 | TB3 |
| 4 | TA1 <- | TB2 |
| 5 | TA2 | TB2 |
| 6 | TA3 | TB2 |

In the present example, TA1 in the first three combinations TA is fixed, and the combination that results in minimal syndrome weight is (TA1,TB2). In the three subsequent combinations, TB is fixed at TB2 and the optimal combination is (TA1,TB2). Note that the number of combinations scanned per linear descent cycle is $N_t \cdot N_s$, which is typically much smaller than the $(N_s)^{N_t}$ possible combinations of the full search.

The above described method for selecting threshold combinations during the linear descent search was given by way of example. In other embodiments, other suitable methods for selecting threshold combinations, in the vicinity of the anchor threshold combination, can also be used.

At a termination check step 120, the memory controller checks whether additional linear descent cycles are required, and if so, the memory controller loops back to step 116 to apply a subsequent linear descent cycle starting with the recently found optimal threshold combination. Otherwise, the memory controller proceeds to an output step 124, in which the memory controller outputs the optimal threshold combination. In an embodiment, the memory controller terminates the linear descent search at step 120 when the optimal threshold combination was not updated during the recent cycle. In another embodiment, the memory controller terminates the linear descent search when MIN_W falls below a predefined threshold, or after executing a predefined number of linear descent cycles.

In some embodiments, the memory controller adjusts the read thresholds adaptively by executing the method of FIG. 4 periodically. Note that once the method enters the linear descent zone, in subsequent applications of the method, when comparing the weight to the linear descent threshold, the method will break directly to the linear descent search, with high probability, as long as the conditions for setting the read thresholds vary slowly.

Applying the linear descent search can be viewed as a tracking procedure, meaning that a valid set of read thresholds has already been found, and these read thresholds are adapted to fit changing conditions. During tracking, the partial syndromes of a read threshold whose position has changed are re-calculated. Since only small threshold-changes are allowed in a tracking iteration, a valid set of read threshold is retained, the syndrome remains unsaturated, and each following iteration may start with the linear descent search.

Processing the Syndrome in Layers for Early Termination

In some of the disclosed embodiments, calculating the syndrome (and its weight) is carried out in portions or chunks that are smaller than the syndrome length. The syndrome is thus divided into multiple chunks, also referred to herein as layers, of L check-bits. Consider a syndrome S that is partitioned into $L_M$ layers, $S=[S(L_1), \ldots, S(L_M)]$. Denoting the weight of the $m^{th}$ layer $W[S(L_m)]$, the weight W(S) is given as:

$$W(S) = \sum_{m=1}^{L_M} W[S(L_m)] \qquad \text{Equation 3}$$

The intermediate syndrome weight up to level m' $1 \le m' \le L_M$ is defined by:

$$W(m') = \sum_{m=1}^{m'} W[S(L_m)] \qquad \text{Equation 4}$$

In some embodiments, the intermediate syndrome weight serves to predict the value of the full syndrome weight W(S). Thus, when the intermediate weight W(m') exceeds a given threshold for some m'<$L_M$, the respective syndrome is expected to be saturated and therefore the weight calculation can be terminated without completing the full weight calculation.

Figure 5:
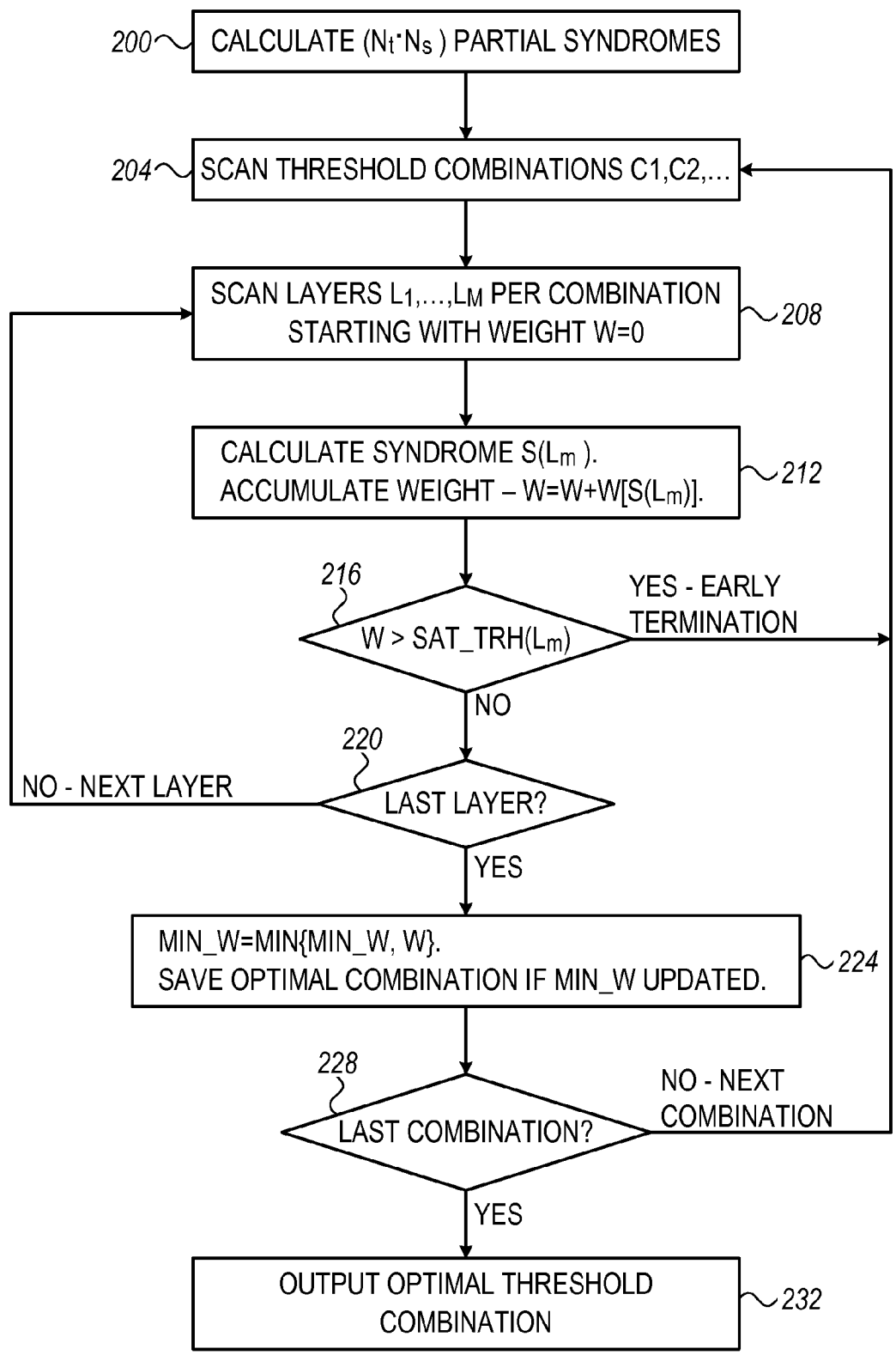
FIG. 5 is a flow chart that schematically illustrates a method for threshold search in which the syndrome weight is processed in layers with possible early termination, in accordance with an embodiment that is described herein.

FIG. 5 is a flow chart that schematically illustrates a method for threshold search in which the syndrome weight is processed in layers with possible early termination, in accordance with an embodiment that is described herein. In the present example we assume that calculating the syndrome is based on pre-calculated partial syndromes, as described above.

The method begins with the memory controller pre-calculating $N_t \cdot N_s$ partial syndromes, at a partial syndrome calculation step 200, similarly to step 104 in FIG. 4. The memory controller then scans threshold combinations C1, C2, . . . at a combination scanning step 204, and for each of the threshold combinations, the memory controller processes M layers $L_1, \ldots, L_M$, at a layer scanning step 208.

At step 208, the memory controller zeros an intermediate weight variable W=0, to be accumulated over the layers.

At an intermediate weight calculation step 212, the memory controller calculates the part of the syndrome corresponding to the current layer $L_m$. In an embodiment, the memory controller retrieves $N_s$ partial syndromes corresponding to the current threshold combination, or parts of the partial syndromes that belong to the current layer, and combines (e.g., using bitwise XOR) the retrieved partial syndromes to produce $S(L_m)$. The memory controller accumulates the intermediate weight as $W=W+W[S(L_m)]$.

At a saturation prediction step 216, the memory controller compares the intermediate weight to a saturation threshold $SAT\_THR(L_m)$, and if W exceeds this threshold, the memory controller terminates the calculation of the current threshold combination and loops back to step 204 to process subsequent threshold combinations. Otherwise, the memory controller proceeds to a layer termination step 220, in which the memory controller checks whether the recently processed layer was the last layer for the current threshold combination. If additional layers should be processed, the memory controller loops back to step 208. Otherwise, the memory controller updates the minimal weight MIN_W and the respective optimal threshold combination, as appropriate, at a minimal weight updating step 224.

At a combination termination step 228, the memory controller checks whether all the combinations have been scanned. If additional threshold combinations are available, the memory controller loops back to step 204. Otherwise, the memory controller outputs the optimal threshold combination at an output step 232, and the method then terminates.

The value of threshold $SAT\_THR(L_m)$ at step 216 determines a false negative probability, i.e., a probability of early termination when the syndrome is actually unsaturated, and a false positive probability, i.e., the probability of proceeding to process subsequent layers even though the syndrome is actually saturated. The value of $SAT\_THR(L_m)$ can be determined analytically or empirically so as to meet predefined requirements regarding the false negative and false positive probabilities.

In some embodiments, the memory controller processes the M layers in an optimal layer ordering that maximizes saturation-indicative information that the intermediate weight W(m') (1≤m'≤M) bears, among all possible layer orderings. Equivalently, the optimal layer ordering minimizes the false negative and false positive probabilities regarding the early termination event (as described above.)

Consider, for example, an LDPC code that is represented by a parity-check matrix depicted in Table 4:

TABLE 4

Example LDPC parity-check matrix

|       |   |   |   |   |   |   |   |   |   |   |   |   |
|-------|---|---|---|---|---|---|---|---|---|---|---|---|
| $L_0$ | X | X | X | X | X | X |   |   |   |   |   |   |
| $L_1$ |   |   | X | X | X | X | X | X |   |   |   |   |
| $L_2$ |   |   |   |   | X | X | X | X | X | X |   |   |
| $L_3$ |   |   |   |   |   |   | X | X | X | X | X | X |
| $L_4$ | X | X |   |   |   |   |   |   | X | X | X | X |
| $L_5$ | X | X | X | X |   |   |   |   |   |   | X | X |

The LDPC parity-check matrix in Table 4 comprises six rows of twelve L-by-L blocks, wherein empty blocks represent a zero matrix, and "X" marked blocks represent a circulant matrix that is derived from a unity matrix by circularly shifting the columns of a unity matrix a suitable number of shifts in the range 0 to L−1. In this examples, the layers correspond to block-rows and are denoted $L_0$-$L_5$.

In some embodiments, the layer processing ordering is selected so that the current row-block has minimal overlap with previously processed row-blocks. Such ordering depends on the code structure, i.e., the structure of the parity-check matrix, and can be determined at design time. In the present example, the row-blocks corresponding to each of the layer pairs ($L_0$,$L_3$), ($L_1$,$L_4$) and ($L_2$,$L_5$) are non-overlapping. Therefore, processing the layers in this case can be carried out in an optimal layer ordering {$L_0$,$L_3$, $L_1$,$L_4$,$L_2$,$L_5$}. Note that the optimal layer ordering may not be unique, and other suitable optimal layer orderings can also be used.

In some embodiments, the memory controller updates the read thresholds during an acquisition and/or tracking process executing a threshold search method such as the method of FIG. 5, periodically. In some embodiments, the memory controller may use different sets of layer thresholds $SAT\_THR(L_m)$ in different applications of the threshold search method.

In an embodiment, the memory controller holds multiple sets of M saturation thresholds, and selects a suitable set of saturation thresholds based on a syndrome weight calculated in previous applications of the method. For example, assume that the syndrome weight calculated in a given activation of the method results in a low syndrome weight. In the following activation of the method, the memory controller may lower one or more of the saturation thresholds of the recently used set, thus increasing the probability of termination at early layers. The (average) processing time is therefore reduced without compromising the false negative probability.

Threshold Search with Gray Code Ordering of Threshold Combinations

Consider a read operation that requires setting $N_t$ read thresholds, wherein each of the read thresholds can be set at one of $N_s$ possible positions. As explained above, in full threshold search, the memory controller calculates the syndrome over $(N_s)^{N_t}$ threshold combinations. As described above, the memory controller pre-calculates and stores $N_s$ partial syndromes per each of the $N_t$ thresholds. For a given threshold combination, the memory controller retrieves $N_t$ partial syndromes and combines them (e.g., using bitwise XOR) to produce the syndrome. Assuming partial syndromes of P bits, the full search procedure requires reading a total number of $P \cdot N_t \cdot (N_s)^{N_t}$ bits.

In some disclosed embodiments, the memory controller scans the threshold combinations in a specific order so that the syndrome in a given threshold combination can be calculated based on a syndrome calculated in a previous threshold combination. In such embodiments, as will be described below, the memory controller needs to retrieve, per threshold combination, a number of partial syndromes that is much smaller than $N_t$.

Figure 6:
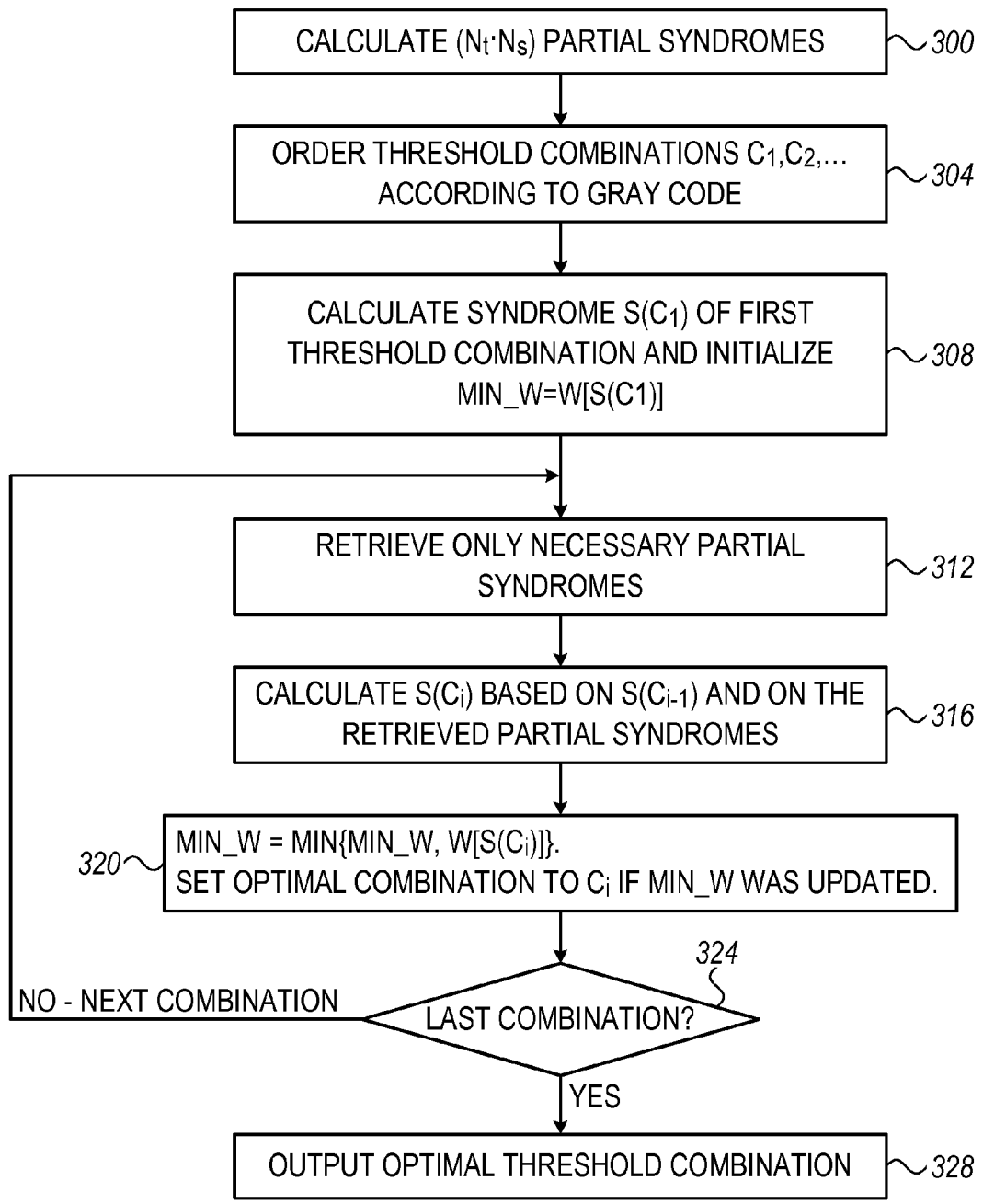
FIG. 6 is a flow chart that schematically illustrates a method for threshold search using Gray code ordering of the threshold combinations, in accordance with an embodiment that is described herein.

FIG. 6 is a flow chart that schematically illustrates a method for threshold search using Gray code ordering of the threshold combinations, in accordance with an embodiment that is described herein. The method of FIG. 6 refers to a read operation that requires $N_t$ read thresholds, wherein each of the read thresholds has $N_s$ different possible positions.

At a partial syndromes calculation step 300, the memory controller calculates and stores $N_s$ partial syndromes per read threshold, i.e., a total number of $N_t \cdot N_s$ partial syndromes, as described above. At a combinations ordering step 304, the memory controller prepares a list of threshold combinations that are ordered according to a Gray code (in base $N_s$). Gray code ordering (or simply Gray ordering, for brevity) means that the position of only one threshold changes between adjacent threshold combinations. Table 5 depicts Gray ordering for the case of two read thresholds TA and TB and three positions per threshold.

TABLE 5

Example Gray ordering for $N_t = 2$, $N_s = 3$

| Threshold combination index | TA position | TB position |
|---|---|---|
| $C_1$ | TA1 | TB1 |
| $C_2$ | TA1 | TB2 |
| $C_3$ | TA1 | TB3 |
| $C_4$ | TA2 | TB3 |
| $C_5$ | TA2 | TB2 |
| $C_6$ | TA2 | TB1 |
| $C_7$ | TA3 | TB1 |
| $C_8$ | TA3 | TB2 |
| $C_9$ | TA3 | TB3 |

In some embodiments, the memory controller orders the list of combinations prior to actually reading any data stored in the memory. In other embodiments, the memory controller scans the threshold combinations in Gray ordering, e.g., using Gray scanning hardware, without preparing a Gray code list.

At an initial combination calculation step 308, the memory controller retrieves $N_t$ partial syndromes that are associated with the initial threshold combination (denoted $C_1$), and calculates the respective syndrome $S(C_1)$ by combining (e.g., XORing) the retrieved partial syndromes. The memory controller further initializes the minimal weight MIN_W to $W[S(C_1)]$.

At a partial syndrome retrieval step 312, the memory controller retrieves only partial syndromes that are necessary for calculating the current syndrome based on the syndrome that was calculated in the previous threshold combination. As will be explained herein, since only one threshold changes between adjacent threshold combinations (because of the Gray ordering), the memory controller needs to read only two (and not all $N_t$) of the partial syndromes associated with the threshold that changes.

At a syndrome calculation step 316, the memory controller calculates the syndrome of the current combination based on the syndrome of the previous combination and on the retrieved partial syndromes. Methods for efficient transition between adjacent combinations are described in detail below.

At an update step 320, the memory controller updates MIN_W and the respective optimal threshold combination, as appropriate. At a combination termination step 324, the memory controller checks whether all the threshold combination have been processed, and if there are additional combinations loops back to step 312 to calculate the syndrome of the following combination in the list. Otherwise, the memory controller outputs the optimal threshold combination at an output step 328, and the method terminates.

Now we describe several methods, which are based on the Gray ordering, and that efficiently calculate the syndrome at step 316. Consider, for example, a transition between adjacent combinations $C_{i-1}$ and $C_i$, in which only one threshold, e.g., threshold TA, changes from position TA1 to position TA2. In this case $S(C_i)=[S(C_{i-1})$ XOR PS(TA1) XOR PS(TA2)]$, and therefore the memory controller needs to retrieve only PS(TA1) and PS(TA2), and not a full set of $N_t$ partial syndromes. The total number of bits read in this embodiment (in exhaustive search) is: $\{P\cdot(2+1)\cdot[(N_s)^{N_t}-1]+P*N_t\}$ bits. In the multiplicative factor (2+1), the number '2' refers to retrieving the two partial syndromes and the number '1' refers to updating the syndrome between adjacent threshold combinations. The first threshold combination is processed differently from the other combinations, and requires $P*N_t$ bits read in fetching the respective $N_t$ partial syndromes.

In some variant embodiments, the previous partial syndrome is stored locally, and is therefore available for XORing out in transitioning to the following threshold combination. In such embodiments, only one partial syndrome is retrieved from the RAM in each combination transition.

In other embodiments, instead of retrieving two partial syndromes, e.g., PS(TA1) and PS(TA2) in the example above, the memory controller pre-calculates and stores the XOR result between the two partial syndromes. These pre-calculated XOR results of partial syndromes pairs are also referred to herein as "transitional partial syndromes." The memory controller thus calculates and stores ($_2^{N_s}$) transitional partial syndromes for each of the $N_t$ read thresholds.

In yet another embodiment, the threshold combinations are ordered in accordance with a reflected-Gray code in which the threshold may change between adjacent combinations to only a neighboring position. In this embodiment, the memory controller pre-calculates and stores only $N_s-1$ transitional partial syndromes per threshold, along with $N_t$ partial syndromes for calculating the syndrome of the first combination in the Gray ordering.

In embodiments that use transitional partial syndromes, the memory controller retrieves, at step 316, a transitional partial syndrome that corresponds to the combination transition, and applies bitwise XOR with the syndrome of the previous threshold combination. The total number of bits read in such embodiments is given by $\{P\cdot(1+1)\cdot[(N_s)^{N_t}-1]+P*N_t\}$ bits.

Table 6 summarizes storage requirements and performance attributes of some of the methods described above.

TABLE 6

Storage requirements and performance in various methods

| Method/ Attribute | Full search | Gray ordering | Reflected-Gray ordering + transitional partial syndromes |
|---|---|---|---|
| Storage in P-bit units | $(N_t \cdot N_s)$ | $(N_t \cdot N_s + 1)$ | $(N_t \cdot N_s + 1)$ |
| Bits read in P-bit units | $Nt \cdot (N_s)^{Nt}$ | $3 \cdot [(N_s)^{N_t} - 1] + P \cdot N_t$ | $2 \cdot [(N_s)^{N_t} - 1] + P \cdot N_t$ |
| Bits read ratio | 1 | Approx. $3/N_t$ | Approx. $2/N_t$ |
| Pre-calculate | $(N_t \cdot N_s)$ partial syndromes | $(N_t \cdot N_s)$ partial syndromes | $N_t$ partial syndromes and $N_t \cdot (N_s - 1)$ transitional partial syndromes |
| Storage organization in RAM | $N_t$ RAMs of $N_s \cdot P$ bits/RAM | $N_s$ RAMs of $N_t \cdot P$ bits/RAM One RAM of P bits for current syndrome | One RAM of $Nt \cdot Ns \cdot P$ bits One RAM of P bits for current syndrome |

In an embodiment that implements the threshold search in hardware, without Gray ordering, the partial syndromes are stored in $N_t$ RAM units that each holds $N_s$ partial syndromes of P bits. This architecture enables the memory controller to retrieve $N_t$ partial syndromes that possibly correspond to different positions of different respective thresholds, simultaneously in the same clock cycle.

In an embodiment that implements the threshold search in hardware, and additionally uses Gray ordering, the partial syndromes may be stored in $N_s$ RAM units that each holds $N_t$ partial syndromes of P bits. This architecture enables the memory controller to carry out a combination transition in a single clock cycle, by retrieving two partial syndromes that belong to the same read threshold in the same clock cycle.

In another embodiment, the memory controller stores transitional partial syndromes, in which case retrieving a single transitional partial syndrome is sufficient for transitioning between adjacent threshold combinations. In this embodiment, the memory controller may store the transitional partial syndromes in a single RAM, which simplifies the implementation.

Processing Syndromes of Multiple Threshold Combinations Simultaneously

In some embodiments, multiple syndromes that are related to different threshold combinations can be processed in parallel. Consider, for example, a read operation that requires $N_t=3$ read thresholds {TA,TB,TC}, and each read threshold has $N_s=3$ possible positions {0,1,2}. In this example, the number of threshold combinations is $3^3=27$. Table 7 below depicts a list of threshold combinations in Gray ordering.

TABLE 7

Threshold combinations in Gray ordering

| Threshold combination index | TA position | TB position | TC position | Processing unit |
|---|---|---|---|---|
| 0 | 0 | 0 | 0 | 1 |
| 1 | 1' | 0 | 0 | 2 |
| 2 | 2' | 0 | 0 | 3 |
| 3 | 2 | 1' | 0 | 3 |
| 4 | 1' | 1 | 0 | 2 |
| 5 | 0' | 1 | 0 | 1 |
| 6 | 0 | 2' | 0 | 1 |
| 7 | 1' | 2 | 0 | 2 |
| 8 | 2' | 2 | 0 | 3 |
| 9 | 2 | 2 | 1' | 3 |
| 10 | 1' | 2 | 1 | 2 |
| 11 | 0' | 2 | 1 | 1 |
| 12 | 0 | 1' | 1 | 1 |
| 13 | 1' | 1 | 1 | 2 |
| 14 | 2' | 1 | 1 | 3 |
| 15 | 2 | 0' | 1 | 3 |
| 16 | 1' | 0 | 1 | 2 |
| 17 | 0' | 0 | 1 | 1 |
| 18 | 0 | 0 | 2' | 1 |
| 19 | 1' | 0 | 2 | 2 |
| 20 | 2' | 0 | 2 | 3 |
| 21 | 2 | 1' | 2 | 3 |
| 22 | 1' | 1 | 2 | 2 |
| 23 | 0 | 1 | 2 | 1 |
| 24 | 0 | 2' | 2 | 1 |
| 25 | 1' | 2 | 2 | 2 |
| 26 | 2' | 2 | 2 | 3 |

In Table 7, marked numbers (e.g., 1') denote a threshold position that changes in transition from the previous combination. In an embodiment, syndrome processing is implemented in $N_s=3$ separate processing units. In each of the processing units TA is fixed at a different position. In Table 7, the rightmost column depicts the assignment of the processing unit to the different threshold combinations.

Table 8 depicts example processing of three combinations in parallel.

TABLE 8

Parallel syndrome processing

| Threshold combination | | | TA position | TB position | TC position |
|---|---|---|---|---|---|
| Unit1 | Unit2 | Unit3 | | | |
| 0 | 1 | 2 | 0/1/2 | 0 | 0 |
| 5 | 4 | 3 | 0/1/2 | 1' | 0 |
| 6 | 7 | 8 | 0/1/2 | 2' | 0 |
| 11 | 10 | 9 | 0/1/2 | 2 | 1' |
| 12 | 13 | 14 | 0/1/2 | 1' | 1 |
| 17 | 16 | 15 | 0/1/2 | 0' | 1 |
| 18 | 19 | 20 | 0/1/2 | 0 | 2' |
| 23 | 22 | 21 | 0/1/2 | 1' | 2 |
| 24 | 25 | 26 | 0/1/2 | 2' | 2 |

Note that the read thresholds change identically in the three processing units. Therefore, the memory controller can retrieve a respective transitional partial syndrome once, and distribute this transitional partial syndrome to all three processing units. In this architecture, a single retrieved transitional partial syndrome serves for producing the syndromes of three ($N_s$) different threshold combinations.

Threshold Search Using Gray Ordering and Syndrome Processing in Layers

In some embodiments that implement a threshold search procedure, the memory controller carries out the syndrome calculation in layers. In the method of FIG. 5, for example, the threshold combinations are not ordered in Gray order, and the memory controller may terminate the syndrome calculation when the intermediate weight indicates a saturated syndrome.

Consider an embodiment in which the memory controller scans the threshold combinations in Gray ordering, and calculates the syndrome of a given combination, in layers, based on the syndrome of the previous combination. Applying early termination approach in this case is infeasible because terminating the syndrome calculation in a given threshold combination breaks the Gray ordering in subsequent layers.

In some disclosed embodiments, the memory controller identifies that positioning a given read threshold at a certain position results in a large number of errors, regardless of the positions of the other read thresholds. As a result, the syndromes of all the threshold combinations that contain this threshold position are expected to be saturated, and are therefore invalid combination candidates and should be excluded from the search. In some embodiments, the remaining combinations still satisfy Gray ordering.

In some embodiments, the memory controller manages a table (denoted VALID_TABLE) of $N_t$ rows by $N_s$ columns to mark the validity status of the threshold positions. The table entries are initialized to zero. When scanning the threshold combinations, a combination for which the syndrome is unsaturated, results in marking the table entries corresponding to the thresholds of the combination. Thus, if a given entry remains unmarked, all the combinations that contain this threshold position have saturated syndromes, and therefore can be skipped in processing subsequent layers.

Assume, for example, that in Table 7, setting TB to position '2' results in a saturated syndrome. The VALID_TABLE in this case, after scanning the 27 combinations, is given in Table 9.

TABLE 9

Example VALID_TABLE

| Threshold | Position 0 | Position 1 | Position 2 |
|---|---|---|---|
| TA | X | X | X |
| TB | X | X | 0 |
| TC | X | X | X |

Figure 7:
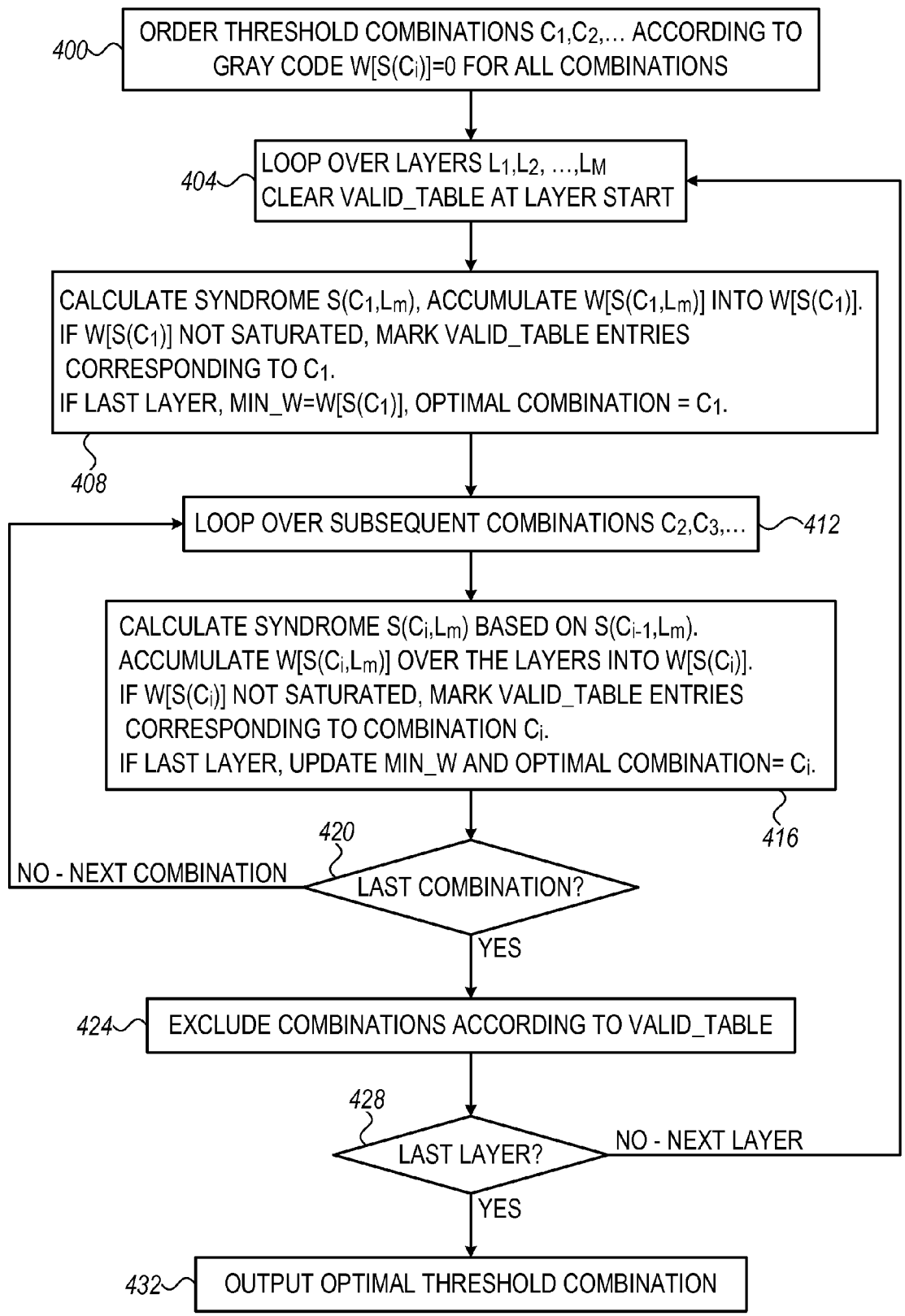
FIG. 7 is a flow chart that schematically illustrates a method for threshold search using Gray code ordering and syndrome processing in layers, in accordance with an embodiment that is described herein.

FIG. 7 is a flow chart that schematically illustrates a method for threshold search using Gray code ordering and syndrome processing in layers, in accordance with an embodiment that is described herein. The method begins with the memory controller ordering the threshold combinations in Gray ordering at a Gray ordering step 400. Further at step 400 the memory controller zeros the weights of all the threshold combinations.

At a layer loop step 404, the memory controller initiates looping over the M layers $L_1 \ldots L_M$, and clears the VALID_TABLE before each layer is processed. At a first combination processing step 408, the memory controller calculates the syndrome of combination C1 and layer Lm, and accumulates the respective layer-weights into $W[S(C_1)]$. If the intermediate value of $W[S(C1)]$ does not indicate that $S(C_1)$ is saturated, the memory controller marks the threshold positions of $C_1$ in VALID_TABLE. When at step 408 the memory controller processes the last layer, the memory controller initiates MIN_W to $W[S(C_1)]$ and sets the optimal combination to $C_1$.

At a combinations loop step 412, the memory controller scans the combination list starting from the second combination C2. At a subsequent combination processing step 416, the memory controller calculates, per layer $L_m$, the syndrome in combination $C_i$ based on the syndrome that was calculated in combination $C_{i-1}$, and accumulates the layer-weights $W[S(C_i,L_m)]$ into $W[S(C_i)]$. If the intermediate value of the accumulated weight does not indicate that S(Ci) is saturated, the memory controller marks the threshold positions of combination $C_i$ in VALID_TABLE. When processing the last layer at step 416, the memory controller updates MIN_W and the optimal combination, as appropriate.

At a combination termination step 420, the memory controller checks whether all the combinations of the current layer have been processed, and if not, loops back to step 412 to process the following combination. Otherwise, the memory controller proceeds to an exclusion step 432 in which the memory controller excludes from the threshold combination list combinations for which the syndrome is saturated as indicated by VALID_TABLE. As a result, in subsequent layers, the memory controller scans a reduced number of combinations, which significantly reduces the overall processing time of the threshold search procedure.

At a layer termination step 428, the memory controller checks whether the last layer has been processed, and if not, loops back to step 404 to process subsequent layers. Otherwise, the memory controller outputs the optimal threshold combination at an output step 432, and the method terminates.

Threshold Search with Coarse/Fine Voltage Resolution

In some embodiments, the voltage resolution of positioning the read thresholds (i.e., the spacing among adjacent positions) changes adaptively. In an example embodiment, the memory controller starts with coarse resolution, i.e., for each read threshold, the $N_s$ (e.g., $N_s=3$ or $N_s=5$) threshold positions are set Vx volts apart from one another and centered about some nominal threshold value. The memory controller finds an optimal threshold combination of the coarse threshold positions using one of the efficient threshold search methods described above.

Then, the memory controller uses the optimal threshold combination as an anchor for setting the read thresholds at a finer resolution, i.e., Vx/2 volts apart from one another, and applies threshold search using the finer resolution positions. Alternatively, other suitable methods for setting the finer resolution thresholds can also be used. The process continues up to some predefined finest resolution. The memory controller uses the threshold combination of the finest resolution for retrieving data stored in the memory.

The methods described above are given by way of example, and in alternative embodiments, other methods can also be used. For example, although in the methods described above the read thresholds share a common number of possible discrete positions, in alternative embodiments, different read thresholds may have different respective number of discrete positions. Moreover, the resolution of the threshold positions (i.e., the voltage spacing between adjacent positions) may differ among different read thresholds, and within the positions of a given read threshold.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   storing data encoded with an Error Correction Code (ECC) in a group of memory cells of a Flash memory device, by converting the data into analog voltages indicative of the data, and writing the analog voltages to the memory cells in the group;
   reading from the memory cells in the group multiple sets of readout results, by comparing the analog voltages of the memory cells to threshold combinations, each comprising multiple read thresholds that are positioned at respective voltages;
   determining a plurality of partial syndromes of the ECC, wherein each partial syndrome is determined over the readout results that were read using a respective threshold combination from a respective subset of the memory cells;
   determining a respective syndrome for each threshold combination in at least a subset of all possible threshold combinations, based on one or more of the partial syndromes that are associated with that threshold combination;

identifying a preferred threshold combination, for which a weight of the respective syndrome is the smallest out of all the possible threshold combinations, by processing less than all the partial syndromes associated with all the possible threshold combinations; and recovering the data stored in the group of memory cells using the preferred threshold combination.

2. The method according to claim 1, wherein identifying the preferred threshold combination comprises identifying a given threshold combination in which the weight of the respective syndrome falls below a predefined weight threshold, and in response to identifying the given threshold combination searching for the preferred threshold combination only among threshold combinations in a vicinity of the identified threshold combination.

3. The method according to claim 2, wherein searching in the vicinity of the identified threshold combination comprises transitioning between adjacent threshold combinations by changing a position of only one of the read thresholds.

4. The method according to claim 1, wherein identifying the preferred threshold combination comprises scanning the threshold combinations in an order in which adjacent threshold combinations differ in a position of only one read threshold, and wherein determining the syndrome comprises calculating the syndrome based on a previous syndrome calculated in a previously scanned threshold combination.

5. The method according to claim 1, wherein determining the syndrome comprises simultaneously determining multiple syndromes, corresponding to respective different threshold combinations.

6. The method according to claim 1, wherein determining the syndrome comprises accumulating syndrome weights corresponding to portions of the syndrome that are determined separately, and terminating determining the syndrome if the accumulated weight exceeds a maximal weight threshold.

7. The method according to claim 6, wherein each of the portions is associated with a respective dedicated maximal weight threshold.

8. The method according to claim 6, wherein identifying the preferred threshold combination is carried out in multiple iterations, wherein determining the syndrome comprises determining the maximal weight threshold in one iteration based on a syndrome weight determined in a previous iteration.

9. The method according to claim 6, wherein determining the syndrome comprises processing the portions in an order that maximizes saturation-indicative information that the accumulated weight bears.

10. The method according to claim 1, wherein identifying the preferred threshold combination comprises identifying an invalid position of one of the read thresholds, which causes syndrome saturation regardless of positions of other thresholds, and excluding, from the subset of threshold combinations, a threshold combination that contains the invalid position.

11. The method according to claim 1, wherein identifying the preferred threshold combination is carried out in multiple iterations, wherein each iteration starts with the threshold combination selected in a previous iteration, and wherein positions of the read thresholds in a given iteration are determined at a resolution finer than in the previous iteration.

12. An apparatus, comprising:
an interface configured to communicate with a Flash memory device comprising multiple memory cells; and
storage circuitry, configured to:
store data encoded with an Error Correction Code (ECC) in a group of the memory cells, by converting the data into analog voltages indicative of the data, and writing the analog voltages to the memory cells in the group;
read from the memory cells in the group multiple sets of readout results, by comparing the analog voltages of the memory cells to threshold combinations, each comprising multiple read thresholds that are positioned at respective voltages;
determine a plurality of partial syndromes of the ECC, wherein each partial syndrome is determined over the readout results that were read using a respective threshold combination from a respective subset of the memory cells;
determine a respective syndrome for each threshold combination in at least a subset of all possible threshold combinations, based on one or more of the partial syndromes that are associated with that threshold combination;
identify a preferred threshold combination, for which a weight of the respective syndrome is the smallest out of all the possible threshold combinations, by processing less than all the partial syndromes associated with all the possible threshold combinations; and
recover the data stored in the group of memory cells using the preferred threshold combination.

13. The apparatus according to claim 12, wherein the storage circuitry is configured to identify a given threshold combination in which the weight of the respective syndrome falls below a predefined weight threshold, and, in response to identifying the given threshold combination, to search for the preferred threshold combination only among threshold combinations in a vicinity of the identified threshold combination.

14. The apparatus according to claim 13, wherein the storage circuitry is configured to transition between adjacent threshold combinations by changing a position of only one of the read thresholds.

15. The apparatus according to claim 12, wherein the storage circuitry is configured to scan the threshold combinations in an order in which adjacent threshold combinations differ in a position of only one read threshold, and to determine the syndrome based on a previous syndrome determined in a previously scanned threshold combination.

16. The apparatus according to claim 12, wherein the storage circuitry is configured to simultaneously determine multiple syndromes, corresponding to respective different threshold combinations.

17. The apparatus according to claim 12, wherein the storage circuitry is configured to determine the syndrome by accumulating syndrome weights corresponding to portions of the syndrome that are determined separately, and to terminate determining the syndrome if the accumulated weight exceeds a maximal weight threshold.

18. The apparatus according to claim 17, wherein the storage circuitry is configured to process the portions in an order that minimizes an average number of the portions processed before terminating calculation of the syndrome.

19. The apparatus according to claim 12, wherein the storage circuitry is configured to identify an invalid position of one of the read thresholds, which causes syndrome saturation regardless of positions of other thresholds, and to exclude, from the subset of threshold combinations, a threshold combination that contains the invalid position.

20. The apparatus according to claim 12, wherein the storage circuitry is configured to identify the preferred threshold combination in multiple iterations, wherein each iteration starts with the threshold combination selected in a previous iteration, and to determine positions of the read thresholds in a given iteration at a resolution finer than in the previous iteration.

\* \* \* \* \*